United States Patent [19]

Miller

[11] 4,353,037

[45] Oct. 5, 1982

[54] AMPLIFIER PROTECTION CIRCUIT

[75] Inventor: Gene D. Miller, Arlington Heights, Ill.

[73] Assignee: Motorola, Inc., Schaumburg, Ill.

[21] Appl. No.: 176,628

[22] Filed: Aug. 11, 1980

[51] Int. Cl.³ .............................................. H02H 7/20
[52] U.S. Cl. ...:.............................. 330/298; 330/207 P; 455/117
[58] Field of Search ...................... 330/207 P, 298; 455/117, 127

[56] References Cited

U.S. PATENT DOCUMENTS

| | | | |
|---|---|---|---|
| 3,366,883 | 1/1968 | Griffin et al. | 325/144 |
| 3,641,451 | 2/1972 | Hollingsworth et al. | 330/134 |
| 3,652,898 | 3/1972 | Steeves | 317/27 |
| 3,852,669 | 12/1974 | Bowman et al. | 330/207 P X |
| 3,870,957 | 3/1975 | Straw | 317/43 X |
| 4,019,150 | 4/1977 | Lurey et al. | 330/2 |
| 4,114,108 | 9/1978 | Falkenberry et al. | 330/207 P |
| 4,122,400 | 10/1978 | Medendorp et al. | 330/207 P |

FOREIGN PATENT DOCUMENTS 517988 7/1976 U.S.S.R. ........................ 330/207 P

Primary Examiner—James B. Mullins
Attorney, Agent, or Firm—James A. Scheer; James W. Gillman

[57] ABSTRACT

A protection circuit for a transmitter amplifier which provides power leveling and controls transmitter output power as a function of the ratio of reflected power to forward power. The circuit senses forward power level and develops a first voltage which is compared with the reference voltage to provide a control voltage which controls the power developed by the transmitter amplifier. Reflected power is sensed and a second voltage is developed which is compared to a portion of the first voltage and causes a reduction in the reference voltage when the reflected power to forward power ratio exceeds a predetermined level.

7 Claims, 2 Drawing Figures

AMPLIFIER PROTECTION CIRCUIT

BACKGROUND OF THE INVENTION

A. Field of the Invention

This invention relates to amplifier protection circuits and more particularly to a fixed ratio VSWR protection circuit which provides power leveling and VSWR protection.

B. Description of the Prior Art

VSWR mismatch protection circuits are used in RF transmitter circuits to insure that power output circuitry is not damaged when the antenna is uncoupled or when the antenna is suddenly damaged or broken. One type of protection circuit employed provides protection by sensing the current to the final amplifier and reducing the current to a preceding stage with increases in final amplifier current. However, it is possible for a transmitter amplifier to be connected to an improper load, such as an open circuit, and still draw the required amount of current. In such a case, the amplifier will dissipate both the power developed, called "forward power", and the power reflected by the improper load, called the "reflected power". If the amplifier is not capable of dissipating the combined forward and reflective power, it can be seriously damaged before any increase in the amplifier current is sensed.

Another type of protection circuit commonly used senses increases in reflected power, and decreases the power of the transmitter in response. Such circuits do not protect against increases in forward power of the transmitter amplifier due to variations in supply voltage and circuit characteristics, which can cause overdissipation of the transmitter amplifier. Some of these prior art circuits continuously cut back the gain of the transmitter amplifier in a linear fashion such that the overall output gain of the amplifier can be less than optimum even though protection is not required. In addition, since the reflected power may increase with an increase in forward power and no allowance is made in the protection circuit for increased forward power, the reflected power sensing mechanism of such prior art circuits can falsely cut back the gain of the transmitter amplifier when the forward power is increased. Thus, it is desirable to provide a protection circuit which controls the output power of a transmitter based upon the ratio of the reflected power to the forward power when that ratio exceeds a certain dangerous threshold.

SUMMARY OF THE INVENTION

Accordingly, it is an object of this invention to provide a protection circuit for a transmitter amplifier which controls transmitter output power as a function of the ratio of reflected power to forward power.

It is another object of this invention to provide a protection circuit for a transmitter amplifier which maintains a predetermined power level until a predetermined ratio of the reflected power to forward power is exceeded.

It is still another object of this invention to provide a protection circuit for a transmitter amplifier which permits forward power to be adjustable.

In practicing the invention, a protection circuit is provided for a transmitter amplifier which senses variation in forward and reflected power and maintains a safe forward power level. A directional coupler and detector circuit is coupled to the transmitter output to act as a sensing circuit to sense the forward and reflected power level and to generate a forward power signal representative of the forward power and a reflected power signal representative of the reflected power. A portion of the forward power signal and the reflected power signal are coupled to a first comparator circuit. The first comparator circuit generates a reference voltage which is reduced in response to the ratio of reflected power to the forward power exceeding a predetermined level. The reference voltage and the forward power signal are coupled to a second comparator means. The second comparator means generates a control signal which varies in accordance with the difference between the reference voltage and the forward power signal. This second comparator means is coupled to the transmitter amplifier such that the control signal varies the power developed by the transmitter amplifier.

BRIEF DESCRIPTION OF THE DRAWINGS

The features of the present invention which are believed to be novel are set forth with particularity in the appended claims. The invention itself, together with further objects, features and advantages thereof, may best be understood by reference to the following description when taken in conjunction with the accompanying drawings.

DETAILED DESCRIPTION OF THE PREFERRED EMBODIMENT

Figure 1:
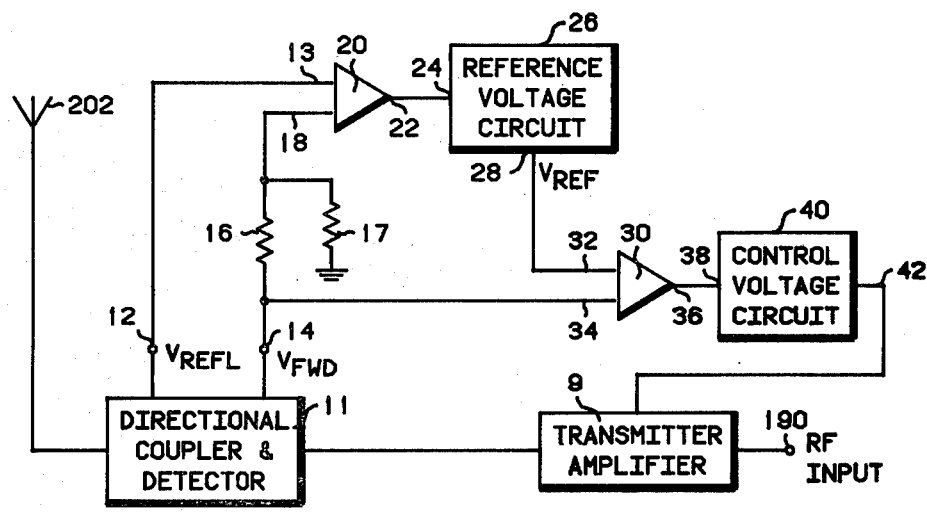
FIG. 1 is a generalized block diagram of the novel protection circuit according to the invention.

Referring to FIG. 1, there is shown a generalized block diagram of a protection circuit 5 constructed in accordance with the present invention. Modulated RF signals are coupled to a transmitter amplifier 9 via an RF input 190 where they are amplified to the desired RF power level and coupled to an antenna 202 via a directional coupler and detector circuit 11. The antenna 202 radiates the RF signal so that it can be picked up by desired receivers.

The RF power developed by the transmitter amplifier 9 and coupled to the antenna 202 is commonly termed "forward power". As the transmitter amplifier 9 and the antenna 202 are not electrically ideal elements, part of the forward power coupled to the antenna 202 will be reflected back to the transmitter amplifier 9. If the antenna 202 should accidentally be broken or short circuited, all of the RF power will be coupled from the antenna 202 back to the transmitter amplifier 9. The RF signal reflected from the antenna 202 back to the transmitter amplifier 9 is commonly termed "reflected power".

Forward power developed by the transmitter amplifier 9 and reflected power coupled back to the transmitter amplifier 9 are sensed by the directional coupler and detector circuit 11, which develops a forward power signal $V_{FWD}$ representative of the forward power, and a reflected power signal $V_{REFL}$ representative of the reflected power. The forward power signal $V_{FWD}$ is coupled to an input terminal 14 of the protection circuit 5 and the reflected power signal $V_{REFL}$ is coupled to another input terminal 12 of the protection circuit 5, as shown.

The forward power signal $V_{FWD}$ is coupled from the input terminal 14 to the input 34 of a comparator stage 30. The comparator stage 30 comprises a differential or operational amplifier with appropriate feedback (not shown). A reference voltage $V_{REF}$ is coupled to the input 32 of the comparator stage 30 from the output 28 of a reference voltage circuit 26. The comparator stage 30 constantly compares the forward power signal $V_{FWD}$ to the reference voltage $V_{REF}$ and develops a signal proportional to the difference between the reference voltage $V_{REF}$ and the forward power signal $V_{FWD}$ at its output 36. The signal at the output 36 of the comparator stage 30 is applied to the input 38 of a control voltage circuit 40 which amplifies the signal to produce a control voltage at its output 42. This control voltage is then coupled from the output 42 of the control voltage circuit 40 to the transmitter amplifier 9 so as to control the power output.

Since the output voltage of the comparator stage 30 is proportional to the difference between the reference voltage $V_{REF}$ and the forward power signal $V_{FWD}$, the control voltage is also proportional to that difference. As a result, any change in the output power (and therefore $V_{FWD}$) results in a change in the control line voltage which returns the output power to its original value. As an example, if the output power drops due to a drop in the supply voltage, the $V_{FWD}$ will also drop. This will result in an increase in the difference between $V_{FWD}$ and $V_{REF}$ causing the control voltage to increase. The increased control voltage will cause the transmitter amplifier 9 to increase the power output to its original value. Thus, this part of the circuit provides power leveling by automatically adjusting the control line voltage so that the forward power signal $V_{FWD}$ is approximately equal to the reference voltage $V_{REF}$. In the preferred embodiment, the reference voltage circuit 26 allows $V_{REF}$ to be adjusted, thereby permitting the output power to be adjustable.

To provide protection against excessive reflected power, the reference voltage $V_{REF}$ is reduced, thus reducing output power, whenever the ratio of reflected power to forward power exceeds a preset threshold. This reduction of the reference voltage is controlled by a comparator stage 20. The reflected power signal $V_{REFL}$ is coupled from the input terminal 12 to the input 13 of the comparator stage 20. The comparator stage 20 comprises a differential or operational amplifier with appropriate feedback (not shown). The forward power signal $V_{FWD}$ is applied to a second input 18 of the comparator stage 20 via the resistor network composed of the resistors 16 and 17. The resistors 16 and 17 form a divider network which couple a predetermined portion of the forward power signal $V_{FWD}$ to the input 18 of the comparator 20. As a result, the comparator stage 20 compares the reflected power signal $V_{REFL}$ to a percentage of the forward power signal $V_{FWD}$. The percentage of $V_{FWD}$ applied to the comparator stage 20 is determined by the value of the resistors 16 and 17 and the gain of the comparator stage 20. The output 22 of the comparator stage 20 is coupled to the input 24 of the reference voltage circuit 26.

The output 22 of the comparator stage 20 will remain in a low state as long as the ratio of reflected power to foward power is less than the threshold level determined by resistors 16 and 17, and the gain of the comparator stage 20. As long as the output of the comparator stage 20 is in a low state, the reference voltage circuit 26 will generate a predetermined nominal reference voltage at its output 28. However, when the reflected power signal $V_{REFL}$ becomes large enough to exceed threshold, the output 22 of the comparator stage 20 goes high, causing the reference voltage at the output 28 of the reference voltage circuit 26 to reduce to some fixed fraction of the nominal level. Reducing the reference voltage causes the control voltage applied to the transmitter amplifier 9 to be reduced by the action of the comparator stage 30. Thus, the power output of the transmitter amplifier 9 is reduced to a safe level.

Figure 2:
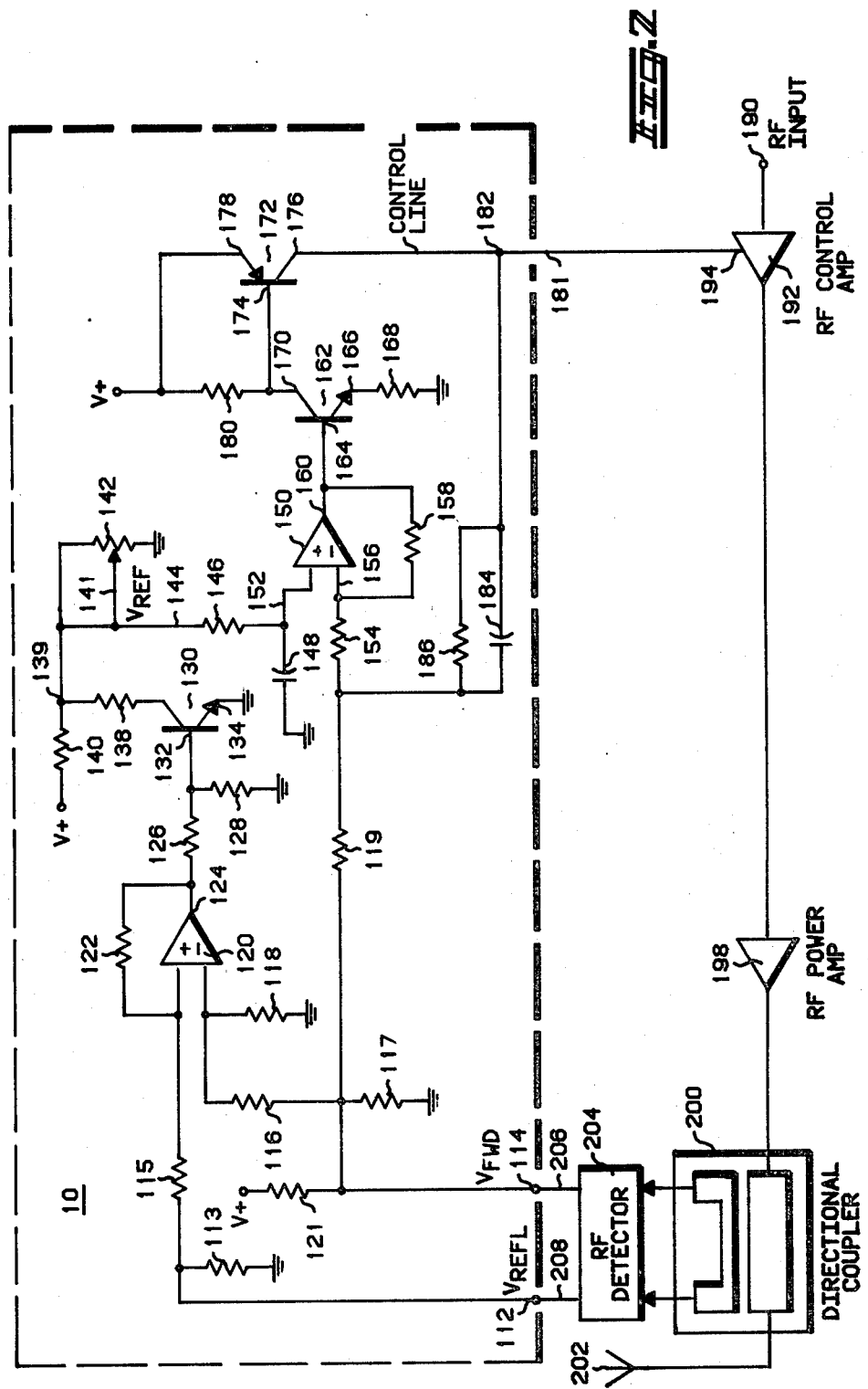
FIG. 2 is a detailed schematic diagram of the preferred embodiment of the novel protection circuit according to the invention.

Referring now to FIG. 2, there is shown a more detailed schematic diagram of the preferred embodiment of the novel protection circuit according to the invention. Modulated RF signals are applied to an input terminal 190 and coupled to an RF control amplifier 192. The amplified signals are then coupled to an RF power amplifier 198 and the resulting output signal is coupled to an antenna 202 via a directional coupler 200. An RF detector circuit 204 is coupled to the directional coupler 200 as shown. A forward power signal $V_{FWD}$ and the reflected power signal $V_{REFL}$, are coupled through the directional coupler 200 and the RF detector 204 to the input terminals 112 and 114 of the protection circuit 10. This forward power signal $V_{FWD}$ is then applied to the inverting input 156 of a comparator stage 150 via resistors 119 and 154, as shown. The comparator stage 150 is preferably a differential or operational amplifier. A resistor 117 serves as a load resistor for the forward power output 206 of the RF detector 204. A resistor 121 is coupled from the terminal 114 to the supply voltage to provide necessary bias to insure proper initial conditions. The comparator stage 150, transistors 162 and 172, together with resistors 154, 158, 168 and 180, form a high gain comparator circuit. The resistors 119, 186 and a capacitor 184, connected as shown, form a negative feedback network which establishes the loop gain and frequency response of the comparator circuit while providing immunity to gain variations. A reference voltage $V_{REF}$ is coupled through a transient filter composed of a resistor 146 and a capacitor 148, to the non-inverting input 152 of the comparator stage 150 via the conductor 144, as shown. The high gain comparator circuit composed of comparator stage 150 and transistors 162 and 192, constantly compares the forward power signal $V_{FWD}$ to the reference voltage $V_{REF}$, and applies to the control line 181 a control signal proportional to the difference between the reference voltage $V_{REF}$ and the forward power signal $V_{FWD}$. The signal is coupled via the control line 181 to the control input 194 of the RF control amplifier 192. Since the control voltage is proportional to the difference between the reference voltage $V_{REF}$ and the forward power signal $V_{FWD}$, the change in output power, and therefore in $V_{FWD}$, results in an opposite change in the control line voltage. This returns the output power to its original value. Thus, power leveling is providing by changing the control line voltage to keep the forward power signal $V_{FWD}$ approximately equal to the reference voltage $V_{REF}$.

The reflected power protection is provided by reducing output power, by controlling the value of the reference voltage $V_{REF}$, when the ratio between reflected power and forward power exceeds a predetermined threshold. The reflected power signal $V_{REFL}$ from the output 208 of the RF detector 204 is coupled to the terminal 112 and from the terminal 112 to the non-inverting input of a comparator stage 120. In the preferred embodiment, the comparator stage 120 is a differential or operational amplifier. The comparator stage 120 and the resistor network composed resistors 113, 115, 122, connected as shown form a comparator with hysteresis. The hysteresis is introduced in order to overcome non-linearities inherent in the directional coupler detector circuit. The resistor 113 also serves as a load resistor for the reflected power output 208 of the RF detector 204. The forward power signal $V_{FWD}$ is coupled from the terminal 114 to the inverting input of the comparator stage 120 via the resistor network composed of resistors 116 and 118, as shown. This permits the comparator stage 120 to continually compare the reflected power signal $V_{REFL}$ to a predetermined fraction of the forward power signal $V_{FWD}$, where the predetermined fraction is determined by the value of the resistors 116 and 118 and by the gain of the comparator. The output of the comparator stage 120 will remain low as long as the reflected power signal $V_{REFL}$ is less than the predetermined fraction of the forward power signal $V_{FWD}$. The exact relationship is given by the following expression:

$$V_{RFEL} < V_{FWD}\left[\left(\frac{R_{118}}{(R_{116} + R_{118})}\right) \times \left(\frac{(R_{115} + R_{122})}{R_{122}}\right)\right] \quad (1)$$

As long as the expression (1) is valid, the output 124 of the comparator stage 120 will be low. This low voltage is coupled to the base 132 of a transistor 130 through a resistor network composed of resistors 126 and 128, thereby maintaining the transistor 130 in the "off" state. Coupled to the collector 136 of the transistor 130 is a resistor network composed of resistors 140, 138 and variable resistor 142 as shown. When the transistor 130 is in the "off" state, the voltage at the node 139 will be a maximum. This voltage is the nominal reference voltage $V_{REF}$ and is determined by the voltage divider ratio of the resistor 140 and the variable resistor 142. This reference voltage $V_{REF}$, is coupled via the conductor 144 to the input 152 of the comparator stage 150 through the low-pass transient filter composed of resistor 146 and capacitor 148. By varying the position of the wiper 141 of the variable resistor 142, the reference voltage $V_{REF}$ can be adjusted, permitting the power output to be adjustable. Thus, it can be seen from the above description, an adjustable, nominal reference voltage is generated when the reflected power signal is less than the threshold value given by expression (1). However, if the reflected power increases such that expression (1) is not true, then the output 124 of the comparator stage 120 goes "high". The resistors 126 and 128 are chosen so that a "high" causes the transistor 130 to saturate. The reference voltage $V_{REF}$ at the node 139 then becomes a lower value determined by the resistor network composed of resistors 140, 138 and the variable resistor 142. Since this new reference voltage (cutback reference) is less than the initial nominal reference voltage, power output will be cutback. By proper selection of the resistors 138, 140 and 142, the cutback power level can be made to be the same percentage of the nominal power setting (as determined by the position of the wiper 141) over a wide range of nominal power settings. In addition, since the cutback reference voltage is a fixed value, the reduced forward output power will be power leveled even in the cutback mode.

From the foregoing description it can be seen that a protection circuit has been provided which controls output power based upon the ratio of reflected power to forward power. In addition, the circuit provides power leveling even in the reduced power mode and permits the nominal output power to be adjustable.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed herein.

What is claimed is:

1. A protection circuit, for controlling the power of a transmitter amplifier which produces an output varying in response to a control signal applied thereto, comprising:

sensing means, coupled to the transmitter amplifier, for generating a forward power signal representative of the forward power and reflected power signal representative of the reflected power;

first comparator means, coupled to the sensing means for generating a reference voltage at an output, and for reducing the reference voltage to a predetermined value in response to the ratio of the reflected power to the forward power exceeding a predetermined level; and second comparator means, having a first input coupled to the output of the first comparator means and a second input coupled to the sensing means, for generating a control signal which varies in accordance with the difference between the reference voltage and the forward power signal, said second comparator means being coupled to the transmitter amplifier for applying said control signal thereto to vary the power developed by the transmitter amplifier.

2. The protection circuit of claim 1 wherein the first comparator means comprises:

first differential amplifier means, having a non-inverting input for receiving the reflected power signal and an inverting input for receiving a predetermined portion of the forward power signal, and having an output signal which is low when the reflected power signal is less than the predetermined portion of the forward power signal and high when the reflected power signal is greater than the predetermined portion of the forward power signal; and, amplifier means coupled to the output of the differential amplifier means, for generating at an output, a nominal reference voltage when the differential amplifier means output signal is low, and for reducing the reference voltage to the predetermined value when the differential amplifier means output signal is high.

3. The protection circuit of claims 1 or 2 wherein the second comparator means comprises:

second differential amplifier means, having a non-inverting input coupled to the output of the first comparator means, and having an inverting input coupled to the sensing means, for generating a signal at an output which varies in accordance with the difference between the reference voltage and the forward power signal;

amplifier means, for generating a control signal in response to the signal at the output of the second differential amplifier means; and coupling means, for coupling the control signal to the transmitter amplifier.

4. The protection circuit of claims 1 or 2 wherein the sensing means comprises a directional coupler.

5. The protection circuit of claims 1 or 2 wherein the reference voltage is adjustable.

6. The protection circuit of claim 3 wherein the sensing means comprises a directional coupler.

7. The protection circuit of claim 3 wherein the reference voltage is adjustable.

* * * * *